(12) United States Patent
Yoneda et al.

(10) Patent No.: US 8,514,052 B2
(45) Date of Patent: Aug. 20, 2013

(54) SURFACE-MOUNTED RESISTOR AND SUBSTRATE FOR MOUNTING THE SAME THEREON

(75) Inventors: Masaki Yoneda, Kyoto (JP); Makoto Toyonaga, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 279 days.

(21) Appl. No.: 13/109,276

(22) Filed: May 17, 2011

(65) Prior Publication Data
US 2011/0285498 A1 Nov. 24, 2011

(30) Foreign Application Priority Data

May 18, 2010 (JP) ................................. 2010-113779
Mar. 24, 2011 (JP) ................................. 2011-065383

(51) Int. Cl.
*H01C 1/02* (2006.01)

(52) U.S. Cl.
USPC .......................... 338/329; 338/22 R; 338/306

(58) Field of Classification Search
USPC ........................................ 338/22 R, 306, 329
See application file for complete search history.

(56) References Cited

U.S. PATENT DOCUMENTS

| | | | | |
|---|---|---|---|---|
| H498 H | * | 7/1988 | Keller et al. | 361/772 |
| 2009/0212883 A1 | * | 8/2009 | Albrecher et al. | 333/182 |
| 2011/0285498 A1 | * | 11/2011 | Yoneda et al. | 338/306 |
| 2012/0043854 A1 | * | 2/2012 | Otsuka et al. | 310/311 |

FOREIGN PATENT DOCUMENTS

| | | |
|---|---|---|
| JP | 07-201507 | 8/1995 |
| JP | 07-230901 | 8/1995 |
| JP | 08-115803 | 5/1996 |
| JP | 08-203701 | 8/1996 |
| JP | 11-068284 | 3/1999 |
| JP | 2001-297942 | 10/2001 |
| JP | 2002-325302 | 11/2002 |

\* cited by examiner

*Primary Examiner* — James Harvey
(74) *Attorney, Agent, or Firm* — Hamre, Schumann, Mueller & Larson, P.C.

(57) ABSTRACT

A surface-mounted resistor includes a flat-type base member having a first surface, a second surface, and a lateral surface. Each of the first and second surfaces has a rectangular shape. The surface-mounted resistor also includes a resistance element formed on the first surface; a pair of internal electrodes formed on both ends of the resistance element by being partially superposed with the resistance element; and a pair of external electrodes. Each of the external electrodes has a first bended portion having an L-shape formed by an internal electrode connection portion and a lateral portion, and a second bended portion having an L-shape formed by the lateral portion and a substrate connection portion. The internal electrode and the internal electrode connection portion are fixed to each other through a conductive fixation material, and a position of the base member is biased in a thickness direction toward the first bended portion.

20 Claims, 11 Drawing Sheets

SURFACE-MOUNTED RESISTOR AND SUBSTRATE FOR MOUNTING THE SAME THEREON

CROSS-REFERENCE TO RELATED APPLICATIONS

This application is based upon and claims the benefit of Japanese Patent Application No. 2010-113779, filed on May 18, 2010, and Japanese Patent Application No. 2011-065383, filed on Mar. 24, 2011, the entire contents of which are hereby incorporated by reference.

TECHNICAL FIELD

Embodiments described herein relate to a surface-mounted resistor to be mounted on a printed substrate and the like, and a surface-mounted substrate for mounting the surface-mounted resistor thereon.

BACKGROUND

A surface-mounted resistor to be mounted on a surface-mounted substrate is generally used in, e.g., a vehicle. For example, Patent Document 1 (Japanese Laid-Open Patent Publication No. (Hei) 7-201507) discloses a chip resistor that has been proposed by the applicants of the present disclosure. As described in paragraph [0002] of Patent Document 1, vehicle electronic components are required to be capable of withstanding high voltages.

Patent Document 2 (Japanese Laid-Open Patent Publication No. (Hei) 8-203701) discloses a chip-type fixed resistor used in a circuit such as a vehicle electronic component, to which a surge voltage is applied. More particularly, Patent Document 2 provides a chip-type fixed resistor having an improved surge withstanding property that suppresses discharge between electrodes. As shown in FIG. 2 of Patent Document 2, a pair of lateral electrodes covering a part of an upper surface electrode is provided on a lateral surface of an alumina substrate.

Patent Document 3 (Japanese Laid-Open Patent Publication No. (Hei) 11-68284) discloses a surface-mounted electronic component for restraining fatigue, cracks, and breaks due to thermal stress that is generated at a solder fillet tip and a solder joint. For such property, recesses and protrusions are provided on an electrode that is disposed on both lateral surfaces of the surface-mounted electronic component. In this way, stress concentration may be alleviated.

Patent Document 4 (Japanese Laid-Open Patent Publication No. (Hei) 7-230901), which has been filed by the applicants of the present disclosure, discloses a surface-mounted type electronic component for alleviating impact applied to a lead terminal in the process of being mounted on a surface-mounted substrate. For this purpose, the surface-mounted type electronic component is mounted on the surface-mounted substrate by interposing a buffer member therebetween.

Patent Document 5 (Japanese Laid-Open Patent Publication No. (Hei) 8-115803) discloses a chip resistance component that is surface-mountable on a printed wiring board. More particularly, Patent Document 5 describes that a soldering section of the chip resistance component is not cracked or peeled upon being mounted. As described in paragraph [0007] and shown in FIGS. 1(a) through 1(c) of Patent Document 5, a hole 16 is provided in a vertical portion 15a so as to strengthen a connection between an external electrode 15 and a resistance element 10. Also, with reference to FIG. 5 of Patent Document 5, an external electrode 45 is made up of a vertical portion 45a, a lower portion 45b, a lateral portion 45c, and an upper portion 45d. As shown in FIG. 5 of Patent Document 5, the external electrode 45 is attached on both ends of the resistance element 10 by burying the lateral portion 45c through an insert molding. Further, surfaces of the vertical portion 45a, the lower portion 45b, and the upper portion 45d are aligned on the same level as a surface of the resistance element 10, thereby being exposed to the outside.

Patent Document 6 (Japanese Laid-Open Patent Publication No. 2001-297942) discloses an electronic component provided with terminals. The electronic component has durability against stress applied from a circuit board in the process of being mounted on the circuit board by soldering. Also, the terminals of the electronic component are configured in a flat structure (i.e., a low height structure) that restrains problems caused by the insufficiency and suction of a solder in the mounting process.

Patent Document 7 (Japanese Laid-Open Patent Publication No. 2002-325302) discloses an apparatus and a method for accurately detecting an electric leakage occurring in a power supply that supplies electric power to a motor used in an electric motor vehicle such as a hybrid car, an electric automobile, and the like. As described in paragraph [0002] of Patent Document 7, an output voltage of the power supply employed in the electric motor vehicle is significantly high, e.g., 200 Volts (V) or more, such that an electric leakage in the power supply may cause significant damage. To address this problem, for the safety in a vehicle electronic system, the power supply should not be directly grounded and a leakage resistance should be detected so as to prevent the electric leakage. The leakage resistance refers to a resistance between the power supply and ground. Therefore, this leakage resistance may be detected by connecting the power supply to ground through a ground resistor of an electric leakage detection circuit. Considering the above, the ground resistor is required to have as large a resistance value as possible so as to prevent the risk of electrical shocks.

FIG. 11 shows a cross-sectional view illustrating a configuration of a surface-mounted resistor that is mounted on a surface-mounted substrate. A surface-mounted resistor 900 includes a flat-type base member 902, a resistance element 904, a protective film 906, a pair of upper electrodes 908, a pair of lateral electrodes 910, and a pair of lower electrodes 912.

The lateral electrodes 910 and the lower electrodes 912 of the surface-mounted resistor 900 are mounted on pads 918 of a surface-mounted substrate 916 by interposing solder fillets 920 therebetween.

Referring to FIG. 12, a partial schematic cross-sectional view illustrating a crack generated in the solder fillet 920 when the surface-mounted resistor 900 (as shown in FIG. 11) is being mounted on the surface-mounted substrate 916 is shown. The material of the flat-type base member 902 such as alumina has a different coefficient of linear thermal expansion from the material of the surface-mounted substrate 916 (serving as an insulation substrate) such as glass epoxy. For this reason, repetitive variations in the temperature in the above structure, where the surface-mounted resistor 900 is mounted on the surface-mounted substrate 916, may cause a shear force to be applied to the solder fillet 920, which in turn causes a crack K thereon.

FIG. 13 shows a schematic cross-sectional view illustrating an electronic component with a pair of L-shaped terminals, which is mounted on a surface-mounted substrate. The electronic component shown in FIG. 13 is a partial variation of the electronic component having electrodes shown in FIG.

9 of Patent Document 6. An electronic component 950 having a pair of L-shaped terminals is provided with an electronic element 952, a pair of internal electrodes 954, a pair of conductive resins 956, and a pair of external electrodes 958.

Each of the external electrodes 958 is provided with a stress alleviation portion 958a. The electronic component 950 is mounted on an insulation substrate 962 by interposing solder fillets 960 therebetween.

The electronic component 950 shown in FIG. 13 is provided with the electronic element 952 and the pair of internal electrodes 954. The electronic element 952 is configured to be mounted on the insulation substrate 962 through the pair of external electrodes 958, such that the stress alleviation portions 958a alleviate shear force applied to the solder fillets 960, thereby preventing the generation of cracks.

The external electrodes 958 and the internal electrodes 954 are fixed to each other by the conductive resins 956 in a direction perpendicular to the insulation substrate 962. However, in this structure, if the electronic component 950 having these electrodes is configured in a flat structure, it may be difficult to secure a large fixation area in a vertical direction. Therefore, there may be a problem that the fixation area between the external electrode 958 and the internal electrode 954 becomes insufficient.

Also, the movement of the stress alleviation portion 958a is limited by the solder fillet 960 formed along the external electrode 958, such that the shear force possibly being applied to the solder fillet 960 may not be sufficiently absorbed by the stress alleviation portion 958a.

Patent Document 1 describes the object of suppressing the deterioration of a surge voltage withstanding property. However, Patent Document 1 merely discloses the structural feature of a chip resistor while it neither suggests nor teaches mounting the chip resistor on the surface-mounted substrate.

Patent Document 2 proposes substantially the same object as Patent Document 1, for suppressing the deterioration of a surge voltage withstanding property. Therefore, Patent Document 2 suggests a rounding treatment on angled portions of both ends of electrodes of the chip resistor. However, Patent Document 2 neither suggests nor teaches possible problems that may be caused during a chip resistor mounting process, and countermeasures for such problems.

Patent Document 3 discloses the surface-mounted electronic component and considers problems such as fatigue, cracks, and breaks due to thermal stress generated at the solder fillet tip and the solder joint. For overcoming the problems, Patent Document 3 suggests that the recesses and protrusions should be provided on the electrodes so as to absorb stresses. Unfortunately, this approach may cause another problem that such electrode structure requires a more complicated manufacturing process resulting in a high manufacturing cost.

Patent Document 4 considers stress that is generated on the electronic component in the process of being mounted on the surface-mounted substrate. For alleviating such stress, Patent Document 4 discloses that the buffer member is formed between a lower surface of the electronic component and the surface-mounted substrate. As described in Patent Document 4, a resin material such as an expanded urethane, a silicone resin and the like, and a rubber material such as a silicone rubber are used as the buffer member. However, in order to precisely control a thickness and an application range of the buffer member, a more complicated manufacturing process and apparatus is necessary, which increases manufacturing cost. Therefore, such approach may not be preferable.

Patent Document 5 discloses the chip resistor component that is surface-mountable on a printed wiring board. As shown in FIG. 5 of Patent Document 5, the external electrode 45 may be similar in shape to an E-shaped external electrode in accordance with one embodiment of the present disclosure. However, the external electrode 45 is configured to be buried through the insert molding, which is structurally different from the external electrode of the present disclosure. Such difference will be apparent from the following descriptions.

Patent Document 6 considers alleviating stress due to thermal expansion and contraction in the circuit substrate. However, as described in Patent Document 6, the external electrodes are disposed on both lateral surfaces of the electronic component.

Patent Document 7 discloses, in paragraph [0018], that the risk of electric shocks is decreased by employing a voltage-dividing resistor in the electric leakage detection apparatus, the voltage-dividing resistor having a large resistance value, for example, 1 to 10 Mega Ohms. However, Patent Document 7 neither suggests nor teaches the structure of a surface-mounted resistor having a large resistance value.

SUMMARY

It is, therefore, an object of some embodiments of the present disclosure to provide a surface-mounted resistor and a surface-mounted substrate, which can alleviate stress due to thermal expansion and contraction made in the surface-mounted substrate when the surface-mounted resistor is mounted thereon, and to improve such alleviation ability against stress.

According to a first aspect of the present disclosure, a surface-mounted resistor comprises a flat-type base member having a first main surface, a second main surface, and lateral surfaces, each of the first main surface and the second main surface having a long side and a short side; and a resistance element formed on the first main surface of the flat-type base member. A pair of internal electrodes is integrally formed with the resistance element to be provided on both ends thereof. Also, each of a pair of external electrodes has a first bended portion, a second bended portion, an internal electrode connection portion, a lateral portion, and a substrate connection portion, wherein the first bended portion is configured to have an L-shape by a combination of the internal electrode connection portion and the lateral portion, and the second bended portion is configured to have an L-shape by a combination of the lateral portion and the substrate connection portion. The internal electrode and the internal electrode connection are fixed to each other through a conductive connection material. A position of the flat-type base member in its thickness direction is deviated toward the first bended portion.

In the surface-mounted resistor according to the first aspect of the present disclosure, the flat-type base member having the resistance element formed thereon is spaced apart from the substrate connection portion provided on the second bended portion and thus, a space portion may be formed between the second main surface of the flat-type base member and the surface-mounted substrate. Through the space portion, stress due to thermal expansion and contraction applied from the surface-mounted substrate to the flat-type base member may be alleviated.

In a second aspect of the surface-mounted resistor according to the first aspect, each of the pair of external electrodes is configured to have a Z-shape by a combination of the first bended portion and the second bended portion, wherein an upper portion of the Z-shaped external electrode is configured as the internal electrode connection portion, a lower portion of the Z-shaped external electrode is configured as the substrate connection portion, a connection portion for connecting the upper portion and the lower portion of the Z-shaped external electrode is configured as the lateral portion. The substrate connection portion is configured to be protruded toward the outer side away from an end of the long side of the flat-type base member. With such configuration, the substrate connection portion being fixed on the surface-mounted substrate is bent toward the outer side to be protruded from the flat-type base member. Therefore, a connection state between the substrate connection portion and the surface-mounted substrate can be easily checked through the eyes of a manufacturer.

In a third aspect of the surface-mounted resistor according to the first aspect, the pair of lateral portions and the second main surface of the flat-type base member are partially fixed to each other through an adhesive. With such configuration, the flat-type base member is fixed at the two internal electrode connection portions of the pair of external electrodes and two points on the second main surface, such that a connection strength of the flat-type base member may be increased.

In a fourth aspect of the surface-mounted resistor according to the first aspect, each of the pair of external electrodes is configured to have an E-shape including an upper spatial region and a lower spatial region, which are divided by a middle portion being provided between the first bended portion and the second bended portion. The flat-type base member is disposed in the upper spatial region of the E-shaped external electrode, whereas the lower spatial region of the E-shaped external electrode is used as a space portion.

With such configuration, the flat-type base member having the resistance element formed thereon is disposed in the upper spatial region of the E-shaped external electrode. The lower spatial region is used as the space portion which may alleviate and absorb thermal stress and mechanical vibration, which are applied from the surface-mounted substrate to the resistance element.

In a fifth aspect of the surface-mounted resistor according to the fourth aspect, a section of the middle portion configuring a part of the E-shape and the second main surface of the flat-type base member are fixed to each other through an adhesive. With such configuration, the second main surface of the flat-type base member is further fixed to the middle portion that is provided on a middle of the E-shaped external electrode. Therefore, a connection strength between the flat-type base member and the pair of external electrodes may be more increased.

In accordance with the present disclosure, a surface-mounted substrate having the surface-mounted resistor formed thereon is provided. The surface-mounted substrate includes a first adhesive surface and a second adhesive surface, which are configured to be connected to both ends of the surface-mounted resistor. A shortest distance between the pair of lateral portions of the surface-mounted resistor is less than a shortest distance between opposite facing ends of the first and second adhesive surfaces. With such configuration, even when the two substrate connection portions of the pair of external electrodes are fixed to the first and second adhesive surfaces through the conductive fixation material such as a solder or the like, it may restrain the spread of a solder wetting up to the space portion that is formed between the second main surface of the flat-type base member and the surface-mounted substrate. As a result, the space portion may serve as a stress alleviation portion for alleviating stress due to thermal expansion and contraction applied from the surface-mounted substrate.

DETAILED DESCRIPTION

First Embodiment

Figure 1:
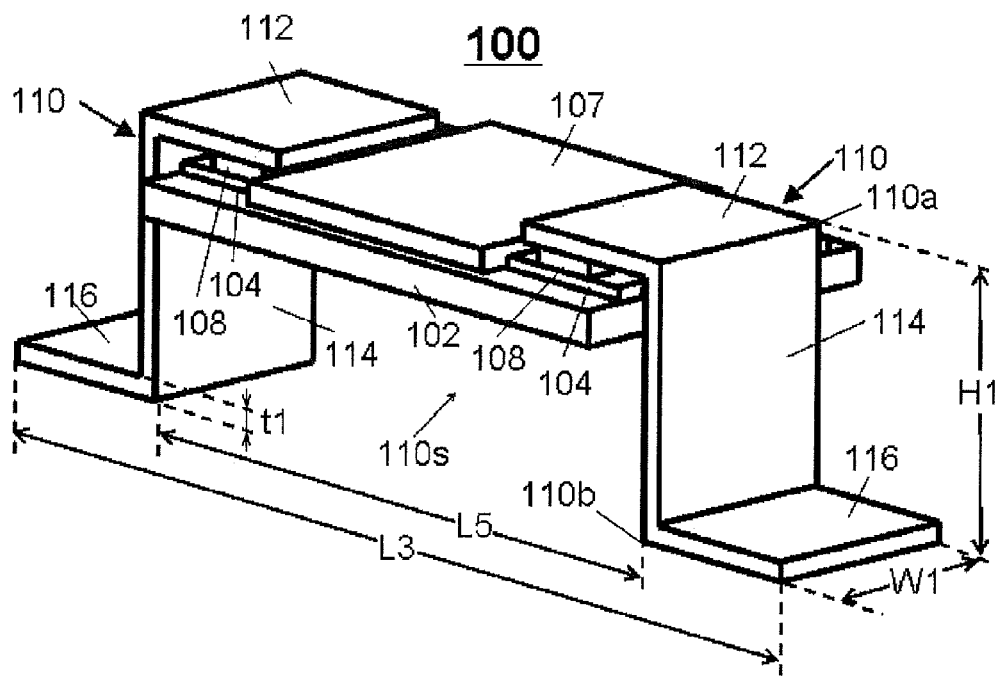
FIG. 1 is a perspective view showing a surface-mounted resistor in accordance with a first embodiment of the present disclosure.

FIG. 1 shows a perspective view of a surface-mounted resistor in accordance with a first embodiment of the present disclosure. A surface-mounted resistor 100 includes a flat-type base member 102, a pair of internal electrodes 104, a resistance element 106, a protective layer 107, conductive fixation materials 108, and a pair of external electrodes 110. The resistance element 106 is disposed under the protective layer 107. The resistance element 106 is not shown in FIG. 1. Further, even though not shown in FIG. 1, a plating treatment may be performed on the pair of external electrodes 110 and the pair of internal electrodes 104. The conductive fixation materials 108 may include solder, paste, or the like.

Each of the pair of external electrodes 110 includes an internal electrode connection portion 112, a lateral portion 114, and a substrate connection portion 116. Each of the pair of external electrodes 110 includes an L-shaped first bended portion 110a formed by a combination of the internal electrode connection portion 112 and the lateral portion 114, and an L-shaped second bended portion 110b formed by a combination of the lateral portion 114 and the substrate connection portion 116. Each of the pair of external electrodes 110 may have an approximate Z shape. For example, the external electrode 110 is bent at the second bended portion 110b in a direction away from the flat-type base member 102 (i.e., in an outer direction) but not in a direction toward the flat-type base member 102 (i.e., in an inner direction). The resistance element 106 is formed on a first main surface of the flat-type base member 102. The flat-type base member 102 and the resistance element 106 may be integrally combined.

A space enclosed by the flat-type base member 102 and the external electrodes 110 is referred to as a space portion 110s. A height H1 of the external electrode 110 is set so as to make the space portion 110s to have a predetermined space volume. The height H1 of the external electrode 10 may be adjusted depending on a thickness of the flat-type base member 102. In the present disclosure, the space portion 110s is prepared to prevent the resistance element 106 formed on the flat-type base member 102 from being affected by stress due to thermal expansion and contraction of a surface-mounted substrate.

In an exemplary embodiment, the height H1 of the external electrodes 110 may be 2.0 mm, a width W1 of the external electrodes 110 may be 3.2 mm, a length L3 between ends of the pair of external electrodes 110 may be 10.4 mm, a length L5 between inner lateral surfaces of the pair of external electrodes 110 may be 8.4 mm, and a thickness t1 of the external electrodes 110 may be 0.1 mm, for example.

Figure 2:
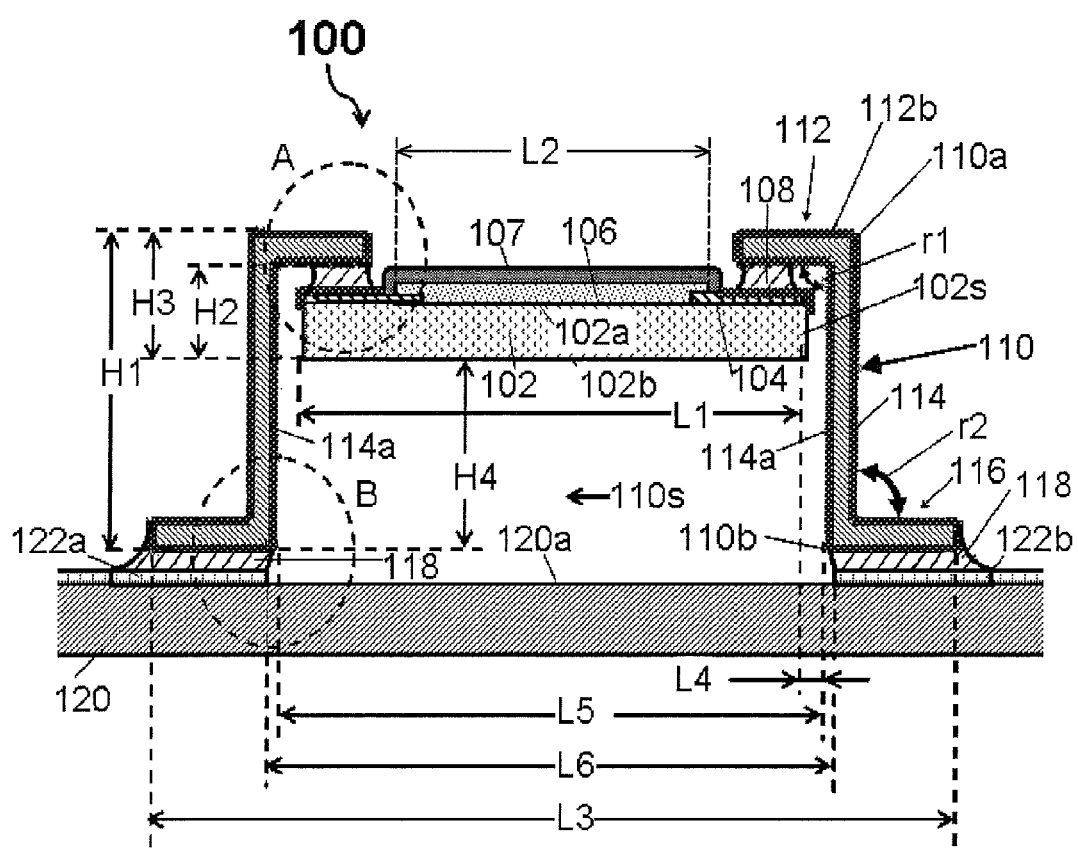
FIG. 2 is a lateral view showing the surface-mounted resistor in accordance with the first embodiment of the present disclosure.

FIG. 2 illustrates a lateral view of the surface-mounted resistor 100 shown in FIG. 1. In FIG. 2, the surface-mounted resistor 100 is mounted on the surface-mounted substrate. In FIG. 2, components or portions corresponding to those of FIG. 1 have the same reference numerals. The surface-mounted resistor 100, as shown in FIG. 1, includes the flat-type base member 102, the pair of internal electrodes 104, the resistance element 106, the protective layer 107, the conductive fixation materials 108, and the pair of external electrodes 110.

The flat-type base member 102 is made of a relatively high purity alumina, e.g., having a purity of 92% or 96%. The alumina has excellent mechanical strength, thermal conductivity, and insulation properties. L1 indicates a length of a long side edge of the flat-type base member 102 in FIG. 2.

The pair of internal electrodes 104 is formed on a first main surface 102a of the flat-type base member 102. The pair of internal electrodes 104 is made of a silver-palladium baked alloy. The internal electrode 104 may be formed extending to an end of the first main surface 102a of the flat-type base member 102 shown in FIG. 2 (for example, an outer lateral surface of the internal electrode 104 may be formed extending to a lateral surface 102s of the flat-type base member 102). Alternatively, the internal electrode 104 may be formed extending to a position, which is spaced a predetermined distance from the end side (the position of the lateral surface 102s) towards the inner side of the first main surface 201a. The resistance element 106 is formed on the first main surface 102a of the flat-type base member 102. The resistance element 106 may be partially superposed with the pair of internal electrodes 104. FIG. 2 shows an example where both end portions of the resistance element 106 are placed over the pair of the internal electrodes 104. Alternatively, the pair of internal electrodes 104 may be placed over left and right portions of the resistance element 106. The resistance element 106 is made of a mixed material including, e.g., ruthenium oxide ($RuO_2$) and glass. A resistance value of the resistance element 106 may be controlled by changing a ratio of mixing the ruthenium oxide ($RuO_2$) and the glass. A rate of containing the glass may be increased to obtain a higher resistance value, whereas a rate of containing the ruthenium oxide ($RuO_2$) may be increased to obtain a lower resistance value. It is known that the ruthenium oxide ($RuO_2$) has an excellent weather resistant property, i.e., a property of resisting deterioration such as deformation, discoloration and degradation.

The resistance element 106 is covered with the protective layer 107. The protective layer 107 may separate and protect the resistance element 106 from contacting the air. Also, the protective layer 107 may protect the resistance element 106 from corrosion caused by a plating solution used in a plating process to be performed on the pair of internal electrodes 104 and the pair of external electrodes 110.

The resistance element 106 is configured to have a rectangular shape. A distance between two conductive regions (i.e., the both lateral ends) of the resistance element 106, i.e., a clearance distance is indicated by L2 in the drawing. Also, the length L2 corresponds to a distance between the pair of internal electrodes 104. Further, a creepage distance indicates the shortest distance along a surface of an insulating material between the two conductive regions. However, in the present embodiment according to the present disclosure, the creepage distance and the clearance distance are substantially the same as each other. Furthermore, respective dimensions of the creepage distance and the clearance distance and a difference between the respective dimensions may vary depending on a structure of the surface mounted resistor 100

The length L2 may vary depending on a withstanding voltage required for the resistance element 106. For example, the applicant found that if a withstanding voltage is, e.g., 1.5 kilovolt (kV), the length L2 is required to be 5.2 mm or more. Therefore, in the present embodiment according to the present disclosure, the length L2 is set to be, e.g., 5.3 mm that is slightly greater than 5.2 mm. A length L1 of the long side of the flat-type base member 102 is set to be, e.g., 7.9 mm by taking into account the length L2 and dimensions of the pair of internal electrodes 104. A length of the short side of the flat-type base member 102 is set to be, e.g., 4 mm. As described above, the length L3 between the ends of the pair of substrate connection portions 116 is set to be, e.g., 10.4 mm.

The protective layer 107 is made of glass and epoxy resin. For example, the resistance element 106 is first covered with the glass, and then the glass just above the resistance element 106 is covered with first and second epoxy resins in turn, thereby making the protective layer 107 to have a three-film lamination structure.

The internal electrode 104 is connected to the external electrode 110 by interposing the conductive connection material 108 therebetween. The conductive connection material 108 may include a solder paste or a conductive resin. For example, the conductive connection material 108 shown in FIG. 2 may include the solder paste.

As described above, each of the pair of external electrodes 110 is provided with the internal electrode connection portion 112 that is connected to the internal electrode 104 by interposing the conductive connection material 108 therebetween, the lateral portion 114, and the substrate connection portion 116. The internal electrode connection portion 112, the lateral portion 114, and the substrate connection portion 116 are integrally formed using the same material. The internal electrode connection portion 112 positioned on an upper side of the external electrode 110 and the lateral portion 114 are combined to form the L-shaped first bended portion 110a. In FIG. 2, an angle r1 of the first bended portion 110a is shown to be a substantially right angle. Alternatively, in some embodiments, the angle r1 may be set to be an acute angle or an obtuse angle. However, when the angle r1 is set to be an acute angle or an obtuse angle, the acute angle or the obtuse angle may be set not to deviate significantly from 90 degrees. Specifically, if the angle r1 is set to be an acute angle of, e.g., 60 degrees or less, a space (or range) for mounting the surface-mounted resistor 102 and the pair of external electrodes 110 may be limited. Therefore, the angle r1 may be set to be in the range of 70 to 120 degrees, more specifically, in the range of 80 to 110 degrees.

The lateral portion 114 and the substrate connection portion 116 are combined to form the L-shaped second bended portion 110b. The external electrode is bent in a direction away from the flat-type base member 102 (i.e., in an outside direction), but not in a direction toward the inner side thereof, to form the second bended portion 110b. With such configuration, the two substrate connection portions 116 can be easily adhered to a first adhesive surface 122a and a second adhesive surface 122b, respectively. Also, this facilitates checking an adhesion status between the two substrate connection portions 116 and the first and second adhesive surfaces 122a and 122b, with the eyes of a manufacturer.

In FIG. 2, an angle r2 of the second bended portion 110b is shown as a substantially right angle. Alternatively, in some embodiments, similar to the angle r1, the angle r2 may be set to be an acute angle or an obtuse angle. Since the second bended portion 110b is integrally formed with the first bended portion 110a, the angle r2 may be set to be substantially the same as the angle r1. For example, the angle r2 may be set to be in the range of 70 to 120 degrees, more specifically, in the range of 80 to 110 degrees.

As described above, each of the pair of external electrodes 110 is made up with a combination of the first L-shaped bended portion 110a and the second L-shaped bended portion 110b. Therefore, if the angles r1 and r2 are set to be acute angles, respectively, each of the pair of external electrodes 110 according to the first embodiment of the present disclosure has a Z-shape.

An inner lateral surface 114a of the lateral portion 114 and the lateral surface 102s of the flat-type base member 102 are spaced apart from each other by a distance L4, instead of being in contact with each other. This configuration may prevent the inner lateral surface 114a and the lateral surface 102s from being damaged by contact therebetween even when the angles r1 and r2 of the first and second bended portions 110a and 110b of the external electrode 110 are set to be acute angles. The distance L4 is set to be, e.g., 0.25 mm.

The length L5 between the inner lateral surfaces 114a of the pair of external electrodes 110 is set to be shorter than a length L6 between the opposite facing ends of the first and second adhesive surfaces 122a and 122b. That is, the first and second adhesive surfaces 122a and 122b are disposed at positions spaced farther from the space portion 110s than the inner lateral surfaces 114a of the external electrode 110. This may prevent a problem related to the space volume decrease of the space portion 110s, which is caused by any protrusions from solders 118 toward the space portion 110s.

The height H1 of the external electrode 110 represents a distance from the first bended portion 110a to the second bended portion 110b. A height H2 denotes a thickness of a main body of the surface-mounted resistor 100. A height H3 indicates a distance from the first bended portion 110a to a second main surface 102b of the flat-type base member 102. A height H4 of the space portion 110s is the same as a value obtained by subtracting the height H3 from the height H1. The height H2 is generally predetermined according to a structure of the external electrode 110. Therefore, a space volume of the space portion 110s is defined depending on the height H1. In order to allow the surface-mounted resistor 100 to be more flat, the height H1 of the external electrode 110 may not be increased. However, in some cases more weight is given to securing more area for space portion 110s rather than having a flatter flat structure, thereby preventing or alleviating stress due to thermal expansion and contraction applied from the surface-mounted substrate 120 to the surface-mounted resistor 100.

For securing the space volume of the space portion 110s in a predetermined dimension, the applicant implemented a prototype of the surface-mounted resistor 100 according to the present disclosure with the following dimensions: the height H1 is set to be 2.0 mm; the height H2 is set to be 0.48 mm; the height H3 is set to be 0.58 mm; the height H4 is set to be 1.42 mm; the length L1 is set to be 7.9 mm; the length L2 is set to be 5.3 mm; the length L3 is set to be 10.4 mm; the length L4 is set to be 0.25 mm; the length L5 is set to be 8.4 mm; and the length L6 is set to be 8.5 mm. Such configuration suggests that a position of the flat-type base member 102 in the thickness direction is significantly biased toward the first bended portion 110a. That is, the position of the flat-type base member 102 is located significantly far away from the second bended portion 110b so as to be biased toward the first bended portion 110a. This configuration provides the space portion 110s between the second main surface 102b of the flat-type base member 102 and a main surface 120a of the surface-mounted substrate 120 when mounting the surface-mounted resistor 100 on the surface-mounted substrate 120.

Also, the length L1 of the flat-type base member 102 corresponds to a length of a typical chip resistor. As well known in the related art, the length L1 of the chip resistor may have a certain limitation. For example, if the length L1 of the chip resistor exceeds 3.2 mm, cracks are likely to form on the chip resistor. For this reason, in manufacturing the chip resistor, the length L1 may be generally limited to be 3.2 mm or less. On the contrary, in accordance with the present disclosure, for improving a voltage withstanding property, the length L1 of the flat-type base member 102 is set to be 7.9 mm, about 2.5 times greater than 3.2 mm. Also, for improving a crack resistant property, the space portion 110s is provided. Therefore, with such configuration of the present disclosure, both the voltage withstanding property and the crack resistant property can be obtained.

In order to verify the dimension of the space portion 110s, a space volume ratio Va may be calculated, wherein the space volume ratio Va represents a ratio of the volume of the space portion 110s to the entire volume of the surface-mounted resistor 100. Assuming that the surface-mounted resistor 100 shown in FIGS. 1 and 2 is a substantially rectangular object, a space volume ratio Va is approximately represented as Va=H4/H1. Since the height H1 denotes a distance between the first bended portion 110a and the second bended portion 110b, it may represent the entire volume of the surface-mounted resistor 100. Further, since the height H4 denotes a height of the space portion 110s, it may represent a volume of the space portion 110s.

Therefore, the space volume ratio Va of the space portion 110s may be approximately represented as Va=H4/H1. For example, in the present embodiment according to the present disclosure, the space volume ratio Va becomes 0.71 (Va=1.42 mm/2.0 mm). The more the space volume ratio Va is increased, the more the influence of thermal stress on the surface-mounted resistor 100 applied from the surface-mounted substrate 120 is decreased. Because there is a limitation in decreasing a thickness, i.e., the height H1, of the surface-mounted resistor 100, giving weight to the space volume ratio Va causes an increase of the height H1, which is contrary to realizing a flat structure. However, when a flat structure is not strongly needed, this may not raise any critical issues. Consequently, the space volume ratio Va may be selected in the range of 0.3 to 0.9 depending on the purpose of the surface-mounted resistor 100. Alternatively, in some embodiments, the space volume ratio Va may be more specifically set to be 0.5 to 0.8.

When the space volume ratio Va becomes zero, the flat-type base member 102 is provided at an approximately middle position between the first bended portion 110a and the second bended portion 110b. Thus, the position of the flat-type base member 102 in the thickness direction is not biased to either of the bended portions. As the space volume ratio Va increases from zero, the degree of bias in the thickness direction is increased. Therefore, the space volume ratio Va also represents the degree of bias of the flat-type base member 102.

Figure 3A:
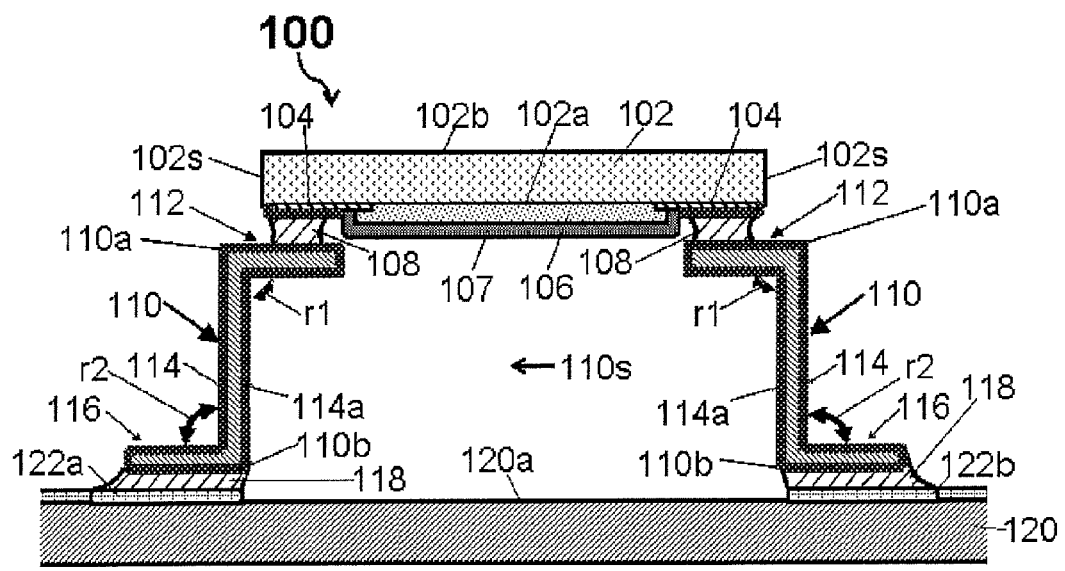
FIG. 3A is a lateral view showing one modification example of the first embodiment according to the present disclosure.

FIG. 3A illustrates one modification example of the first embodiment shown in FIG. 2. In FIG. 3A, components or portions corresponding to those shown in FIG. 2 have the same reference numerals. While the reference numerals shown in FIG. 2 may also be used in FIG. 3A, some of the reference numerals will be omitted for clarity of illustration. The modification example shown in FIG. 3A is different from the first embodiment of the present disclosure shown in FIG. 2 in that the flat-type base member 102 is turned upside down and attached to the pair of external electrodes 110. Specifically, the first embodiment shown in FIG. 2 discloses the flat-type base member 102 that is suspended from the two internal electrode connection portions 112 of the pair of external electrodes 110 by interposing the conductive fixation materials 108 therebetween. On the other hand, the modification example shown in FIG. 3A discloses the flat-type base member 102 that is placed over the two internal electrode connection portions 112 of the pair of external electrodes 110 by interposing the conductive fixation materials 108 therebetween. Therefore, according to the first embodiment shown in FIG. 2, the second main surface 102b of the flat-type base member 102 is located nearer to the second bended portion 110b. On the contrary, according to the modification example shown in FIG. 3A, the second main surface 102b of the flat-type base member 102 is located farther from the second bended portion 110b.

In the modification example of the first embodiment shown in FIG. 3A, the flat-type base member 102 as a part of the surface-mounted resistor 100 includes the first main surface 102a and the second main surface 102b, each of which has a rectangular shape one side of which is longer than the other side, and the lateral surfaces 102s. On the first main surface 102a of the flat-type base member 102, the resistance element 106 having a longer side and a shorter side is formed. Near both ends of the long side of the resistance element 106, a pair of internal electrodes 104 are foamed by being partially superposed with the resistance element 106. The first bended portion 110a has an L-shape that is formed by a combination of the internal electrode connection portion 112 and the lateral portion 114. The second bended portion 110b has an L-shape that is formed by a combination of the lateral portion 114 and the substrate connection portion 116. Each of the pair of external electrodes 110 includes the first bended portion 110a and the second bended portion 110b. The pair of internal electrodes 104 and the internal electrode connection portions 112 are fixed to each other through the conductive fixation materials 108. A position of the flat-type base member 102 in the thickness direction is biased toward the first bended portion 110a that is furthermost positioned from the second bended portion 110b in the external electrode 10.

Also, in the modification example shown in FIG. 3A, the flat-type base member 102 is located at a position outside the space portion 110s. This configuration of the modification example is different from the first embodiment shown in FIG. 2 where the flat-type base member 102 provided with the resistance element 106 formed thereon is located inside the space portion 110s. As shown in FIG. 3A, since the flat-type base member 102 is located outside the space portion 110s in the modification example, heat dissipation efficiency may be increased. Further, in the modification example, the flat-type base member 102 is placed over the internal electrode connection portions 112, so that a mechanical strength of the conductive fixation materials 108, which fix the pair of internal electrodes 104 to the internal electrode connection portions 112, is not strictly required in comparison with the first suspension-type embodiment shown in FIG. 2.

Figure 3B:
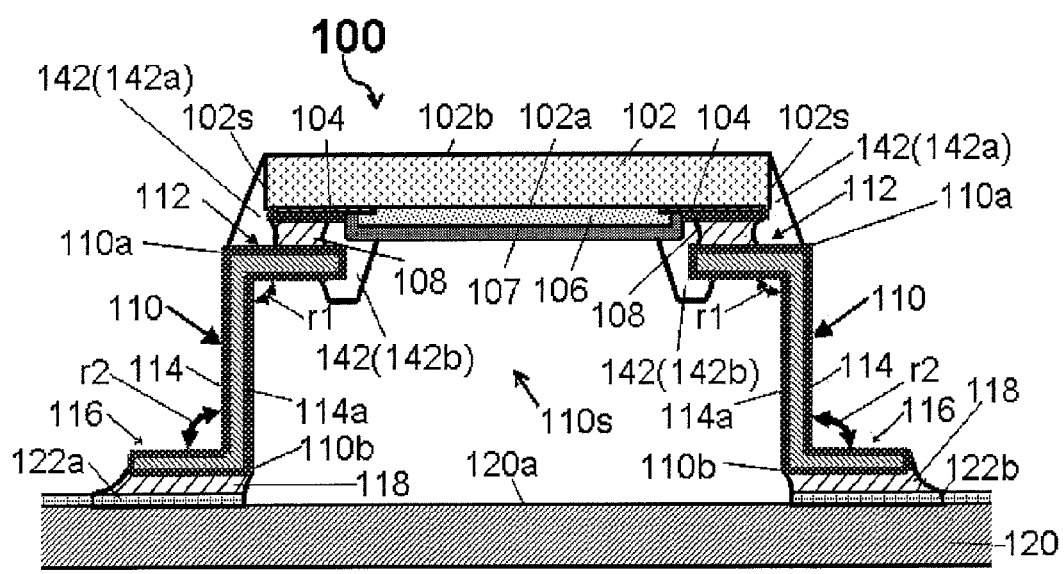
FIG. 3B is a lateral view showing another modification example of the first embodiment according to the present disclosure.

FIG. 3B shows another modification example of the first embodiment according to the present disclosure. This modification example is different from the modification example shown in FIG. 3A in that the lateral surface 102s of the flat-type base member 102 is fixed to the internal electrode connection portion 112 through an adhesive 142 (a protective material made of an insulation resin). With such configuration, a fixation strength between the flat-type base member 102 and the pair of external electrodes 110 may be further increased. Also, the protective material 142 is provided so as to cover the entire surface of the conductive fixation material 108. In FIG. 3B, outer and inner sections of the protective material 142 covering the outside and inside of the conductive fixation material 108 are indicated by reference numerals 142a and 142b, respectively. With such configuration, the conductive fixation materials 108 prevent exposure to the air. The conductive fixation materials 108 are made of, e.g., Ag. If a voltage is applied to the conductive fixation materials 108 while it is in contact with moisture, migration may be generated. However, by covering the conductive fixation materials 108 with the protective material 142, the generation of such migration may be prevented. In addition, the conductive fixation materials 108 may be prevented from being sulfurized. A range of the protective material 142 for covering the conductive fixation material 108 may be in a minimum range. For example, as shown in FIG. 3B, the outer section 142a of the protective material 142 is provided to cover an area ranging from the lateral surface 102s of the flat-type base member 102 to an upper surface of the internal electrode connection portion 112. The outer section 142a does not surmount on the second main surface 102b. The inner section 142b of the protective material 142 is provided to cover an end of the protective layer 107 on the resistance element 106 and a part of a lower surface of the internal electrode connection portion 112. The outer section 142a of the protective material 142 may be configured not to cover the lateral portion 114 of the external electrode 110. Further, the inner section 142b of the protective material 142 may be configured not to cover the lateral portion 114 (the inner lateral surface 114a) of the external electrode 110. The following is a description of the reason why the lateral portion 114 of the external electrode 110 should not be covered with the protective material 142. When the lateral portion 114 is covered with the protective material 142 (142a or 142b), a deformation of the lateral portion 114 is limited by the protective material 142. As a result, it is difficult to sufficiently absorb a shear force generated due to the difference in coefficients of linear thermal expansion between the flat-type base member 102 and the insulation substrate 120 through a deformation of the lateral portion 114. In addition, the protective material 142 covers the conductive fixation material 108 and the internal electrode 104 to prevent them from being exposed to air. Therefore, a sulfurization of the internal electrode 104 is prevented. Alternatively, the protective material 142 may be locally applied only on a part of the first main surface 102a of the flat-type base member 102, but not the lateral surfaces 102s thereof, so that the protective material 142 does not exist on the lateral surfaces 102s. As the protective material 142, for example, an ultraviolet (UV) curing adhesive having a property of being cured in a short time may be used.

Figure 4:
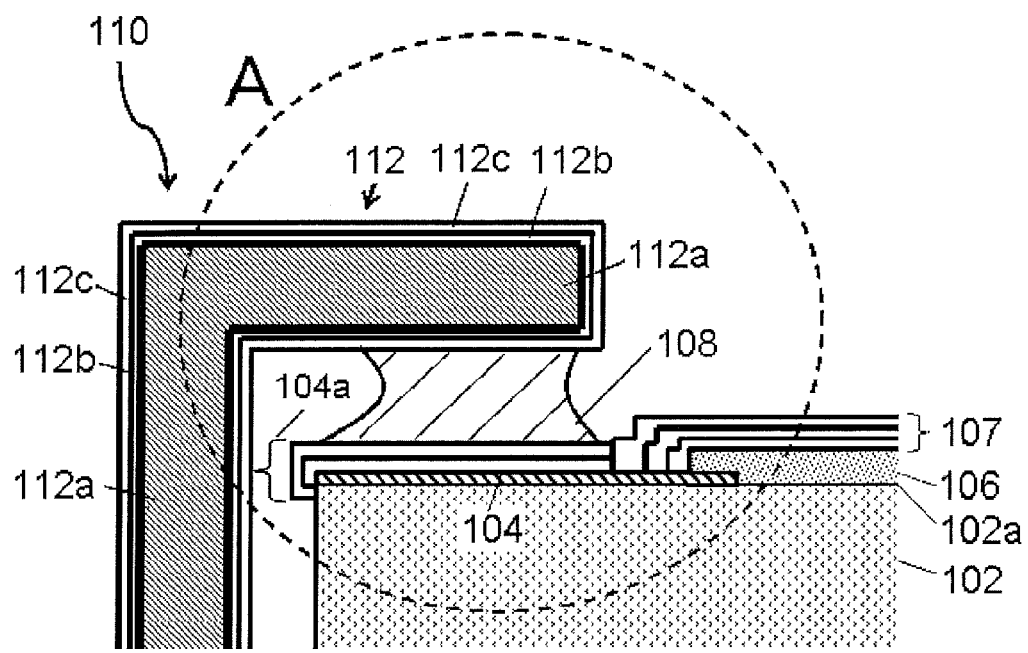
FIG. 4 is a diagram showing a connection between an internal electrode and an external electrode of the surface-mounted resistor shown in FIG. 2.

FIG. 4 illustrates an enlarged view of a circle A shown in FIG. 2. In FIG. 4, the vicinity of the internal electrode connection portion 112 of the external electrode 110 is enlarged. As described above, the external electrode 110 includes the internal electrode connection portion 112, the lateral portion 114, and the substrate connection portion 116. These portions are integrally formed using a same material. For example, an inner plating layer 112b is provided on a base member 112a made of a copper-nickel alloy, and an outer plating layer 112c is provided on the inner plating layer 112b. For example, the inner plating layer 112b mainly contains nickel, whereas the outer plating layer 112c mainly contains tin.

A part of the inner electrode connection portion 112 is electrically connected to the internal electrode 104 through the conductive fixation material 108 by interposing an internal electrode plating layer 104a therebetween. The internal electrode 104 is made of, e.g., silver-palladium or platinum. The internal electrode plating layer 104a is configured in a double-layered structure of, e.g., a nickel plating layer and a tin plating layer so as to prevent solder corrosion.

In FIG. 4, solder is used as the conductive fixation material 108 for fixing the internal electrode 104 to the internal electrode connection portion 112. In this configuration, the internal electrode plating layer 104a, the inner plating layer 112b, and the outer plating layer 112c are required for implementing proper electric conduction therebetween. Alternatively, the internal electrode 104 and the internal electrode connection portion 112 are fixed to each other through the conductive fixation material 108 made of, e.g., a conductive resin. In this configuration, the conductive resin is coated and fixed to the internal electrode 104 and the internal electrode connection portion 112, and then the coated conductive resin is subject to a plating treatment. In this case, the internal electrode plating layer 104a does not need to be interposed between the conductive fixation material 108 and the internal electrode 104. Further, the inner plating layer 112b and the outer plating layer 112c do not need to be disposed between the conductive fixation material 108 and the internal electrode connection portion 112. As a result, the internal electrode 104 and the internal electrode connection portion 112 are directly connected to each other.

As shown in FIG. 2, FIG. 3A, FIG. 3B, and FIG. 4, in the surface-mounted resistor 100 according to the first embodiment of the present disclosure, the resistance element 106 and the internal electrode connection portions 112 are electrically connected to each other through the pair of internal electrodes 104 that are provided on the first main surface 102a of the flat-type base member 102. That is, for the purpose of facilitating manufacturing, the pair of internal electrodes 104 are provided only on the first main surface 102a of the flat-type base member 102, but not on the lateral surfaces 102s of the flat-type base member 102. As such, a formation and manufacturing process of the internal electrode 104 can be performed in a simpler manner and thus a manufacturing cost can be reduced.

Further, the internal electrode 104 is formed on the first main surface 102a of the flat-type base member 102 having a relatively wide area. With such configuration, a fixation area of the internal electrode 104 can be extended, compared to when a fixation area on the lateral surface 102s of the flat-type base member 102 is provided. Therefore, a fixation strength in the internal electrode 104 can be increased.

If the internal electrode 104 is provided on the first main surface 102a of the flat-type base member 102, a fixation area between the internal electrode 104 and the internal electrode connection portion 112 is determined depending on an area of the internal electrode 104. On the other hand, if the internal electrode 104 is provided on the lateral surface 102s of the flat-type base member 102, a fixation area between the internal electrode 104 and the internal electrode connection portion 112 is determined depending on a thickness of the flat-type base member 102. Assuming that a thickness of the flat-type base member 102 is set to be 0.48 mm, a side length of the internal electrode 104 is set to be 0.96 mm, and a width W1 (shown in FIG. 1) of the external electrode 110 is set to be 3.2 mm, if the internal electrode 104 is provided on the lateral surface 102s of the flat-type base member 102, a fixation area becomes 0.48 mm×3.2 mm=1.54 mm$^2$. Alternatively, if the internal electrode 104 is provided on the first main surface 102a of the flat-type base member 102, a fixation area becomes 0.96 mm×3.2 mm=3.07 mm$^2$. As described above, by providing the internal electrode 104 on the first main surface 102a of the flat-type base member 102, it is possible to have a fixation area expanded approximately twice compared to the case of providing the internal electrode 104 on the lateral surface 102s of the flat-type base member 102. If the internal electrode 104 is provided on the first main surface 102a of the flat-type base member 102, a fixation area may be set to be 1.2 times larger or greater, more specifically 1.5 times or greater than when the internal electrode 104 is provided on the lateral surface 102s of the flat-type base member 102.

In other words, one of the features of the present embodiment is that an area of the external electrode 110 facing the internal electrode 104 is set to be wider than that of the external electrode 110 facing the lateral surface 102s of the flat-type base member 102.

The resistance element 106 is formed on the first main surface 102a of the flat-type base member 102. As described above, the resistance element 106 is made of a mixture powder of, e.g., ruthenium oxide ($RuO_2$) and glass. The mixture powder is mixed with an organic binder to form a paste. The paste is applied on the flat-type base member 102 through, e.g., a screen printing and baked at a temperature of 800 to 900 degrees Celsius, thereby forming a thick film of about 10 micrometer (μm) thickness.

The resistance element 106 is covered with the protective layer 107. The protective layer 107 is made of at least one of, e.g., glass and an epoxy resin. In some embodiments, the glass and the epoxy resin may be layered to form the protective layer 107. For example, glass is coated on an upper surface of the resistance element 106, and then a first epoxy resin layer and a second epoxy resin layer are sequentially covered thereon.

As shown in FIG. 4, the flat-type base member 102 with the resistance element 106 formed thereon is suspended from the internal electrode connection portion 112 of the external electrode 110 through the conductive fixation material 108.

Figure 5A:
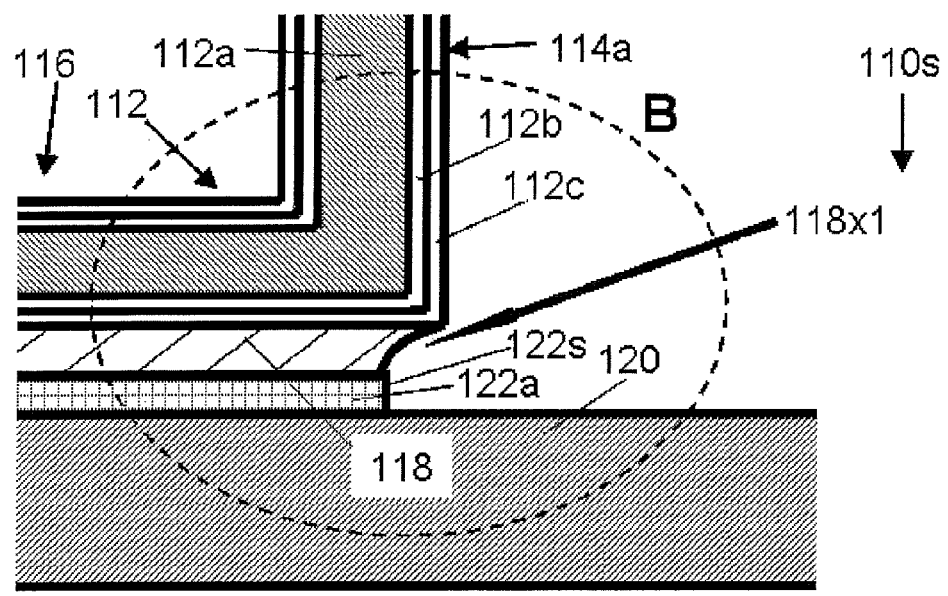
FIG. 5A is a diagram showing one example of a connection between the external electrode of the surface-mounted resistor and an adhesive surface of a surface-mounted substrate in accordance with the first embodiment of the present disclosure, where the adhesive surface is disposed at inner position than the external electrode.

FIG. 5A illustrates an enlarged view of a circle B shown in FIG. 2. Components or portions corresponding to those shown in FIG. 2 have the same reference numerals. As described above, FIG. 4 shows an enlarged view of the vicinity of the internal electrode connection portion 112 of the external electrode 110, whereas FIG. 5A shows an enlarged view of the vicinity of the substrate connection portion 116, which serves as another connection portion of the external electrode 110. On the external electrode 110, the inner plating layer 112b mainly made of nickel and the outer plating layer 112c mainly made of tin are formed.

In the process of mounting the surface-mounted resistor 100 on the surface-mounted substrate 120, the first adhesive surface 122a is disposed at an outer position than the inner lateral surface 114a of the lateral portion 114, i.e., in a direction away from the flat-type base member 102. As a result, the first adhesive surface 122a is disposed at a position away from the space portion 110s. In this way, the solder 118 may not flow into the space portion 110s where the flat-type base member 102 is disposed, such that a protrusion of the solder 118 toward the space portion 110s is prevented. This soldering state is shown as reference numeral 118x1 in FIG. 5. With such configuration, it is possible to prevent the contact of the solder 118 with the flat-type base member 102, thereby restraining the thermal deformation of the resistance element 106 and the reduction of the space portion 110s. Further, by securing the space volume of the space portion 110s with a predetermined dimension, thermal stress of the resistance element 106 applied from the surface-mounted substrate 120 may be restrained. Similar to the first adhesive surface 122a, the second adhesive surface 122b shown in FIG. 2 may provide the same effects.

Figure 5B:
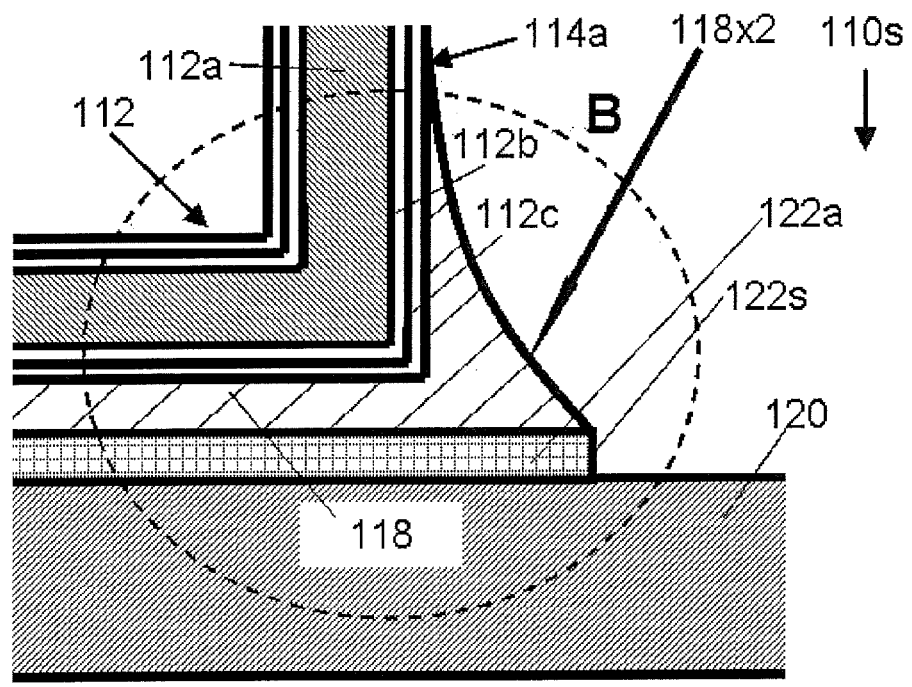
FIG. 5B is a diagram showing another example of connection between the external electrode of the surface-mounted resistor and the adhesive surface of the surface-mounted substrate in accordance with the first embodiment of the present disclosure, where the adhesive surface is disposed at outer position than the external electrode.

FIG. 5B illustrates another configuration of the circle B shown in FIG. 2. Contrary to the example of the soldering state 118x1 shown in FIG. 5A, the soldering state 118x2 shown in FIG. 5B may have some issues as explained below. Specifically, FIG. 5B shows a schematic example in which the first adhesive surface 122a provided on the surface-mounted substrate 120 is extended to a position that is closely located toward the flat-type base member 102, i.e., toward the space portion 110s, more than the inner lateral surface 114a of the lateral portion 114. In the process of mounting the surface-mounted resistor 100 on the surface-mounted substrate 120 with the above-described configuration, a fillet of the solder 110 may be flown along the inner lateral surface 114a, which decreases the space volume of the space portion 110s. As a result, the resistance element 106 is readily affected by the thermal impact and mechanical vibration from the surface-mounted substrate 120. Similar to the first adhesive surface 122a, the second adhesive surface 122b shown in FIG. 2 may provide the same effects.

For solving the problems related to the configuration shown in FIG. 5B, the length L6 representing the shortest distance between the first adhesive surface 122a and the second adhesive surface 122b may be designed to be greater than the length L5 between the inner lateral surfaces 114a of the pair of lateral portions 114 of the surface-mounted resistor 100.

Second Embodiment

Figure 6:
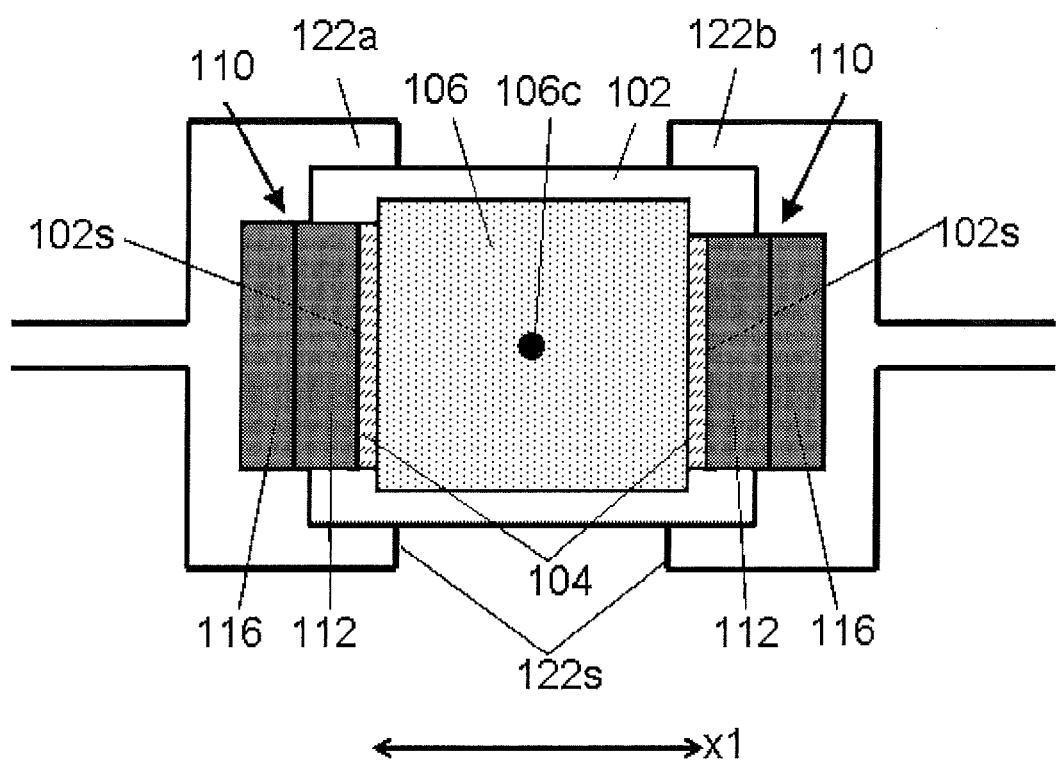
FIG. 6 is a plan view showing a surface-mounted resistor in accordance with a second embodiment of the present disclosure.

FIG. 6 shows a plan view of a second embodiment in accordance with the present disclosure. A surface-mounted resistor 100 includes a flat-type base member 102, a pair of internal electrodes 104, a resistance element 106, and a pair of external electrodes 110. Components or portions corresponding to those shown in FIG. 1 and FIG. 2 have the same reference numerals. Also, in order to clarify the configuration of the resistance element 106, the protective layer 107 (shown in FIG. 2) is not shown in FIG. 6. The protective layer 107 (not shown) is made of a combination of glass and epoxy. Each of the pair of external electrodes 110 includes the internal electrode connection portion 112 and the substrate connection portion 116. Each of the pair of external electrodes 110 also has the lateral portion 114. However, the lateral portion 114 is not shown in the plan view of FIG. 6.

The substrate connection portions 116 are soldered on the first adhesive surface 122a and the second adhesive surface 122b. The first adhesive surface 122a and the second adhesive surface 122b are a part of wiring patterns that are disposed on the surface-mounted substrate 120. When viewed in a direction x1, wiring ends 122s of the first adhesive surface 122a and the second adhesive surface 122b are disposed closer to a center 106c of the resistance element 106 than the lateral surface 102s of the flat-type base member 102.

Figure 7:
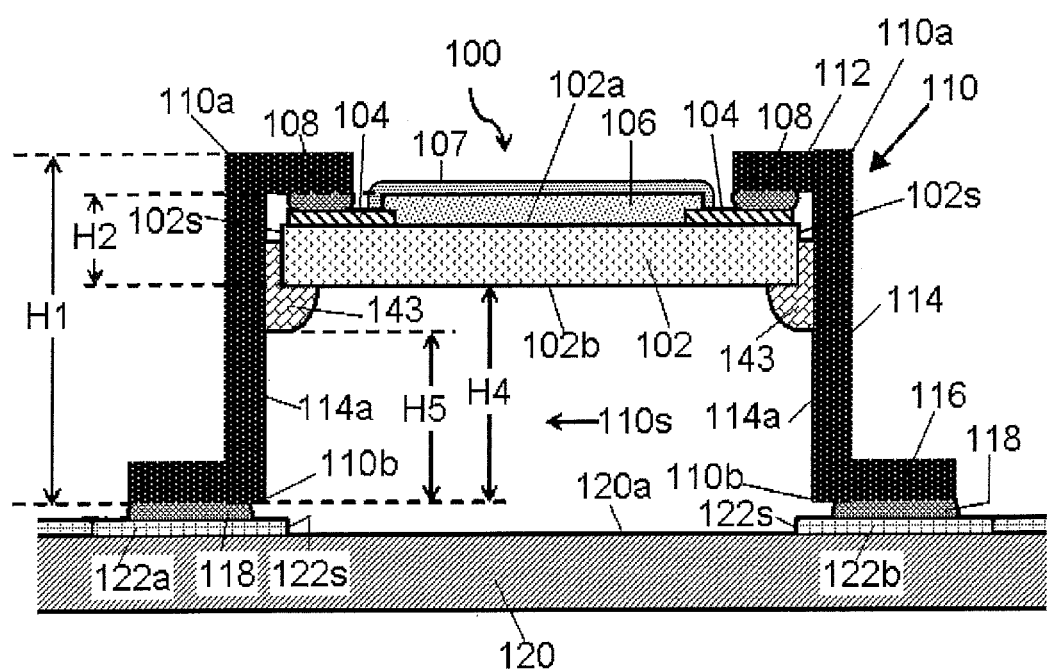
FIG. 7 is a lateral cross-sectional view showing the surface-mounted resistor shown in FIG. 6.

FIG. 7 illustrates a schematic lateral cross-sectional view of the surface-mounted resistor 100 shown in FIG. 6. Components or portions corresponding to those shown in FIG. 1, FIG. 2, and FIG. 6 have the same reference numerals. A major difference from the first embodiment shown in FIG. 2 is that the second main surface 102b and the lateral surface 102s of the flat-type base member 102, and the inner lateral surface 114a of the lateral portion 114 of the external electrode 110 are fixed to each other through an adhesive 143. In this way, the flat-type base member 102 is fixed to the external electrode 110 by interposing the conductive fixation material 108 between the internal electrode 104 and the internal electrode connection portion 112 on the first main surface 102a, while the flat-type base member 102 is fixed to the external electrode 110 by using the adhesive 143 on the second main surface 102b. Therefore, an adhesive strength between the flat-type base member 102 and the external electrode 114 may be further increased. Specifically, as shown in FIG. 7, the flat-type base member 102 is fixed to external electrode 110 at two opposing positions in the thickness direction such that the adhesive strength may be increased.

Depending on the height H2 of the main body of the surface-mounted resistor 100, the height H1 of the external electrode 110 defines the height H4 from the second main surface 102b of the flat-type base member 102 to a bottom surface of the substrate connection portion 116. Further, in a similar manner, the height H1 defines a distance from the second main surface 102b to the main surface 120a of the surface-mounted substrate 120. As a result, the space volume of the space portion 110s is approximately determined by the height H4. While the height H5 from a bottom end of the adhesive 143 to the bottom surface of the substrate connection portion 116 is determined based on the height H4, the bottom end of the adhesive 143 may be disposed as far as possible away from the main surface 120a of the surface-mounted substrate 120. In this way, a decrease of the space volume of the space portion 110s may be restrained. For example, if the height H1 is set to be 2.0 mm, the height H4 may be set to be 1/10 of the height H1 or more, more specifically, 1/2 the height H1 or more. As the space volume (Va=H4/H1) is decreased, it is difficult to set the height H4 to be 1/10 the height H1 or more. In this case, the flat-type base member 102 and the external electrode 110 may be fixed to each other by injecting the adhesive 143 into a gap between the lateral surface 102s of the flat-type base member 102 and the inner lateral surface 114a of the external electrode 110.

As the adhesive 143, a UV (ultraviolet) adhesive may be used, for example. This UV adhesive may be cured within, e.g., several seconds to ten minutes.

Third Embodiment

Figure 8A:
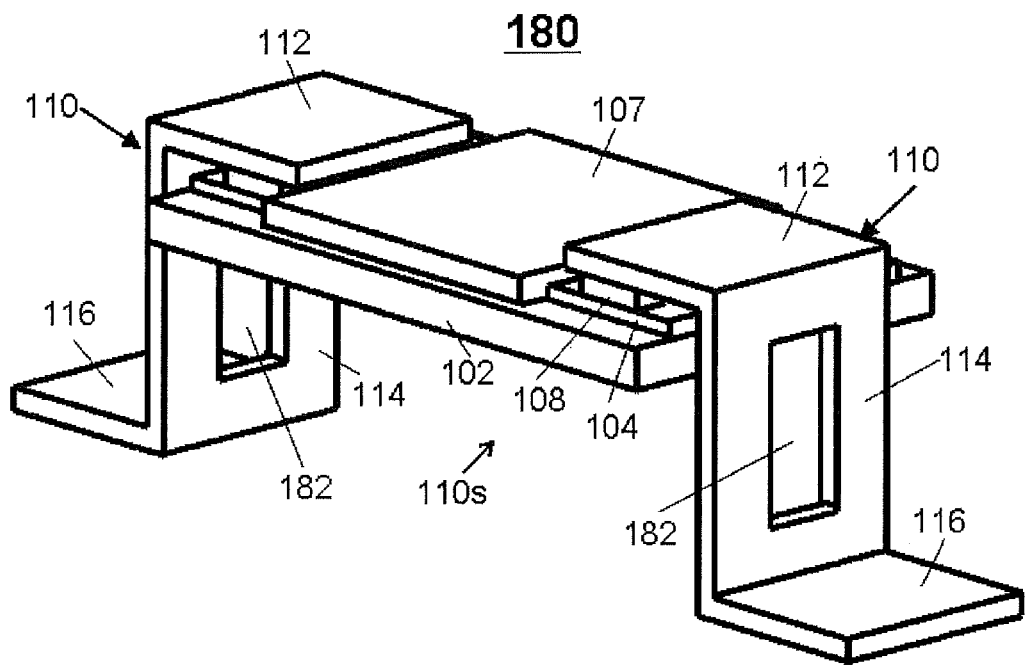
FIG. 8A is a perspective view showing a surface-mounted resistor in accordance with a third embodiment of the present disclosure.

FIG. 8A shows a perspective view of a surface-mounted resistor 180 in accordance with a third embodiment of the present disclosure. A basic configuration of the surface-mounted resistor 180 is the same as the configuration of the first embodiment shown in FIG. 1. A difference from the first embodiment is that slits 182 are provided on the lateral portions 114 of the pair of external electrodes 110. While the pair of Z-shaped external electrodes 110 absorb and alleviate thermal impact through their own Z-shaped structure, the thermal impact may be further absorbed and alleviated through the slits 182. Also, the slits 182 serve as relief spaces for a surplus solder possibly generated when the substrate connection portions 116 are soldered on the first adhesive surface 122a and the second adhesive surface 122b.

The flat-type base member 102 and the pair of external electrodes 110 may be fixed by using the conductive fixation materials 108 that are provided only between the pair of internal electrodes 104 formed on the flat-type base member 102 and the internal electrode connection portions 112. Alternatively, in some embodiments, the second main surface 102b (not shown) of the flat-type base member 102 and the lateral portions 114 may be fixed by using, e.g., the UV adhesive 143 shown in FIG. 7. In this case, the slits 182 serve as relief spaces for a surplus adhesive 143 (shown in FIG. 7) that is possibly generated when the second main surface 102b and the lateral surfaces 102s of the flat-type base member 102, and the lateral portions 114 are adhered to each other. Further, the slits 182 are configured to circulate air from inside and outside of the space portion 110s. This also helps maintain the space volume of the space portion 110s as much as possible. The slits 182 are provided in the thickness direction, e.g., by penetrating the lateral portions 114 from an outer side to an inner side. Alternatively, in some embodiments, without providing the slits 182, recesses and protrusions may be formed on at least one of outer and inner sides of at least one of the lateral portions 114 and the substrate connection portions 116. With such configuration, it is possible to obtain the same effect as the slits 182.

Figure 8B:
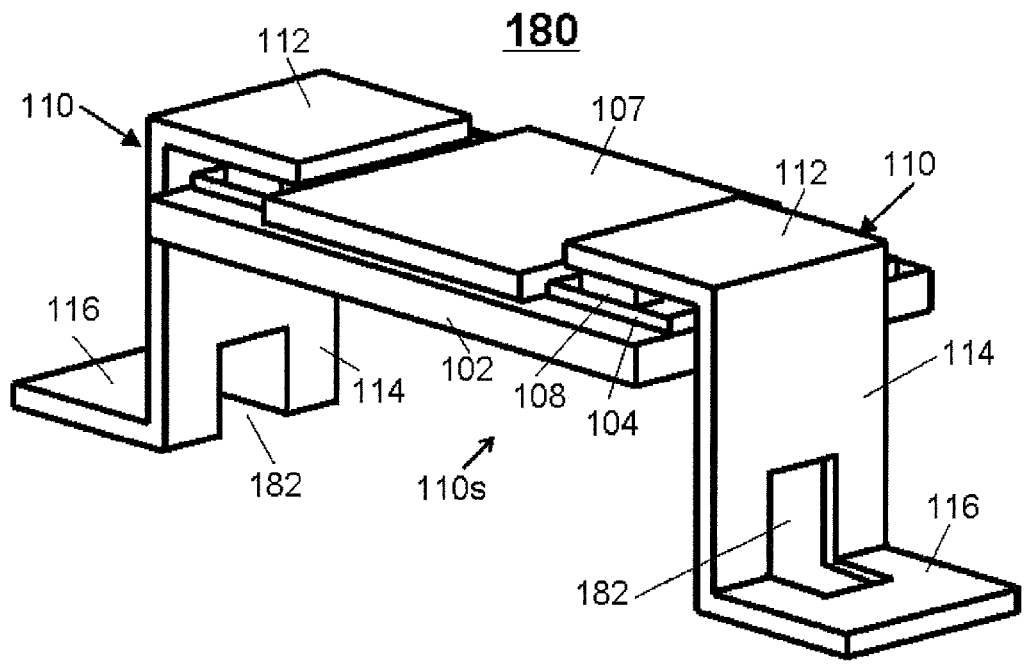
FIG. 8B shows a modification example of the third embodiment according to the present disclosure.

FIG. 8B illustrates a modification example of the third embodiment shown in FIG. 8A. A difference from the example of the third embodiment shown in FIG. 8A is that the slits 182 are provided on both the lateral portions 114 and the substrate connection portions 116. In this configuration where the slits 182 are also provided on the substrate connection portions 116, the slits 182 serve as relief spaces for the surplus solder that is possibly generated when the substrate connection portions 116 are soldered on the first adhesive surface 122a and the second adhesive surface 122b, Further, the slits 182 are configured to alleviate thermal impact between the substrate connection portions 116 and the first and second adhesive surfaces 112a and 122b. Although the slits 182 are shown on both the lateral portions 114 and the substrate connection portions 116 in FIG. 8B, in some embodiments, the slits 182 may be provided on at least one of the lateral portions 114 and the substrate connection portions 116.

Fourth Embodiment

Figure 9:
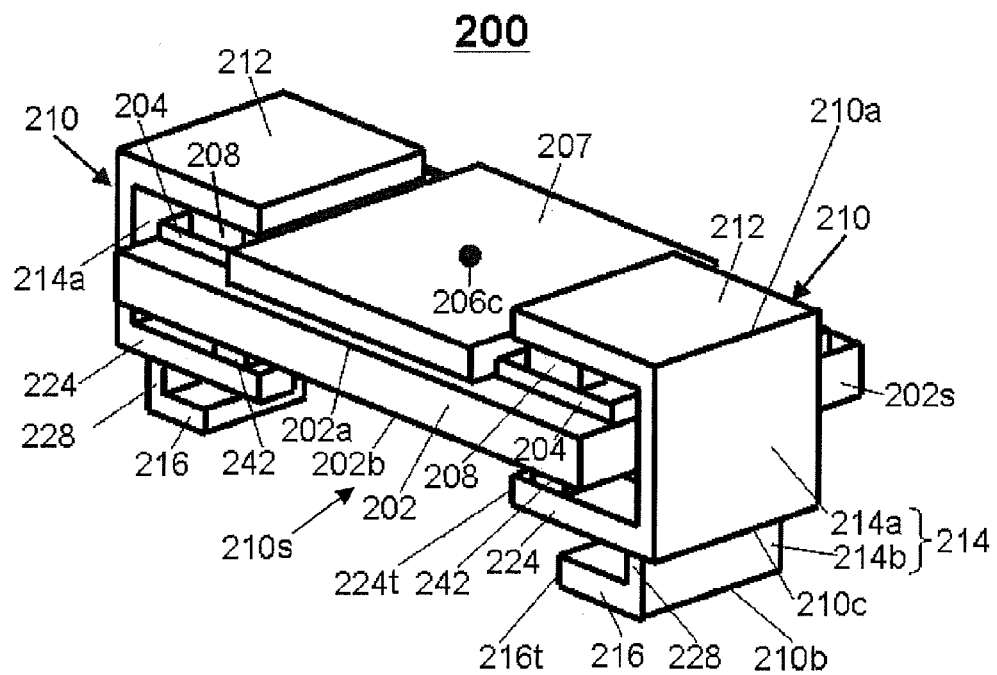
FIG. 9 is a perspective view showing a surface-mounted resistor in accordance with a fourth embodiment of the present disclosure.

FIG. 9 shows a perspective view of a fourth embodiment in accordance with the present disclosure. A major difference from the first to third embodiments is a structure of an external electrode. The other configuration of the fourth embodiment is almost the same as the configuration of the first or second embodiment.

As shown in FIG. 9, a surface-mounted resistor 200 includes a flat-type base member 202, a pair of internal electrodes 204, a resistance element 206, a protective layer 207, conductive connection materials 208, and a pair of external electrodes 210. The resistance element 206 is disposed under the protective layer 207 and is not shown in FIG. 9. The pair of external electrodes 210 and the pair of internal electrodes 204 are plated with, e.g., nickel and tin (not shown).

Each of the pair of external electrodes 210 includes an internal electrode connection portion 212, a lateral portion 214, and a substrate connection portion 216. The external electrode 210 includes a first bended portion 210a having an L-shape formed by a combination of the internal electrode connection portion 212 and the lateral portion 214, and a second bended portion 210b having an L-shape formed by a combination of the lateral portion 214 and the substrate connection portion 216. The lateral portion 214 includes a first lateral portion 214a and a second lateral portion 214b.

In addition to the first bended portion 210a and the second bended portion 210b, the external electrode 210 also includes a third bended portion 210c. The third bended portion 210c is one of the features of the fourth embodiment in accordance with the present disclosure.

In addition to the first to third bended portions 210a, 210b, and 210c, the external electrode 210 includes the internal electrode connection portion 212, a middle portion 224, the substrate connection portion 216, and the lateral portion 214. As described above, the lateral portion 214 includes the first lateral portion 214a and the second lateral portion 214b. The external electrode 210 of the fourth embodiment is E-shaped and is formed by a combination of two U-shaped electrodes having different sizes. This E-shaped external electrode 210 is formed by adding the middle portion 224 between the first bended portion 210a and the second bended portion 210b. In the present embodiment, the E-shaped electrode structure is formed so that the second lateral portion 214b is horizontally shifted toward the flat-type base member 202 so that it is located closer to the flat-type base member 202 than the first later portion 214a. This modified E-shaped external electrode 210 is configured to reduce an entire mounting area by arranging the substrate connection portion 216 mounted on a surface-mounted substrate so that it is located in proximity to the flat-type base member 202 from the first lateral portion 214a. In some embodiments, if the reduction of the mounting area is not critical, the second lateral portion 214b may be provided on a co-plane with the first lateral portion 214a. Further, an end 216t and an end 224t (shown in FIG. 10) may be aligned to be on the same plane, thereby forming the external electrode 210 to have a complete E-shape. Such complete E-shaped external electrode may also be employed in the surface-mounted resistor in accordance with the present disclosure. The external electrode 210 shown in FIG. 9 may be referred to as an E-shaped external electrode in a broad sense. Further, a space (referred to as an upper spatial region) is formed between the internal electrode connection portion 212 and the middle portion 224. In the upper spatial region, the flat-type base member 202 is disposed. Further, a space (referred to as a lower spatial region) is formed between the middle portion 224 and the substrate connection portion 216. The lower spatial region is used as a space portion 210s (shown in FIG. 10).

An end 224t of the middle portion 224 is extended toward a center 206c of the resistance element 206 over an end 202s of the surface-mounted resistor 202. On the other hand, the end 216*t* of the substrate connection portion 216 is extended so that it does not protrude more than the end 224*t* of the middle portion 224. The end 216*t* of the substrate connection portion 216 may be aligned on substantially the same plane with the end 202*s* of the flat-type base member 202.

Figure 10:
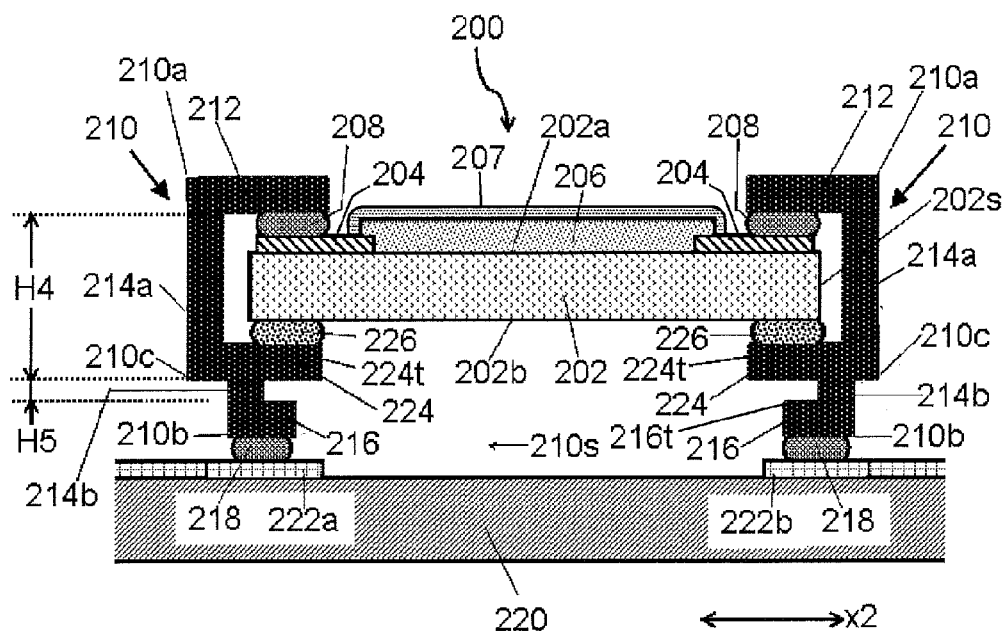
FIG. 10 is a lateral cross-sectional view showing the surface-mounted resistor shown in FIG. 9.
Figure 11:
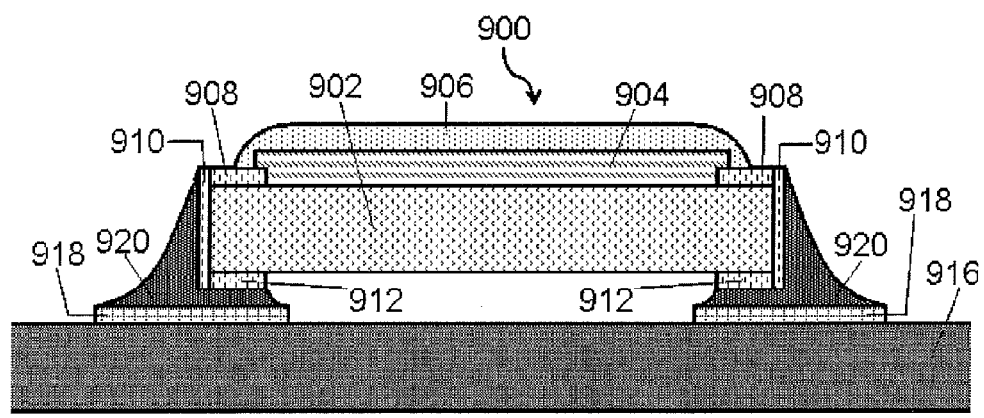
FIG. 11 shows a lateral cross-section view for explaining a conventional surface-mounted resistor.
Figure 12:
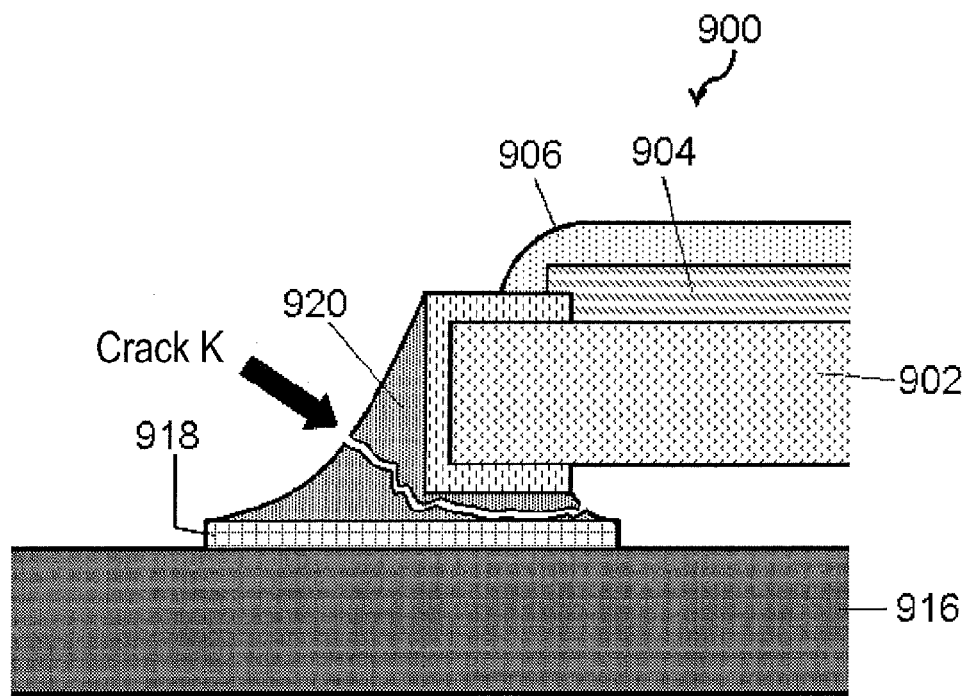
FIG. 12 shows a diagram for explaining a state when a crack is generated on a soldering portion of the conventional surface-mounted resistor shown in FIG. 11.
Figure 13:
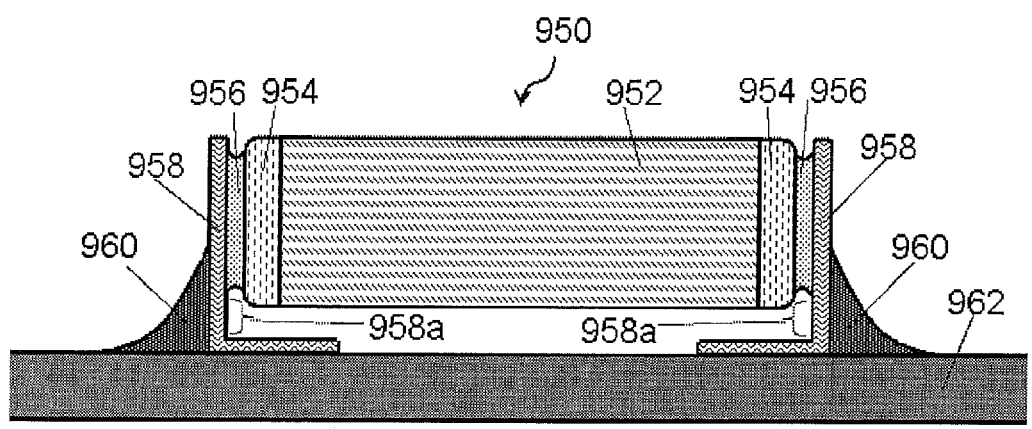
FIG. 13 shows another example of the conventional surface-mounted resistor including a partial modification of an electric element having an L-shaped terminal shown in FIG. 10 of Patent Document 6.

The flat-type base member 202 may be attached to the pair of modified E-shaped external electrodes 210. The resistance element 206 is formed on the flat-type base member 202. The protective layer 207 is provided over the resistance element 206. As the protective layer 207, glass or an epoxy resin may be used. Since the resistance element 206 is covered with the protective layer 207, it is not shown in the perspective view of FIG. 9. However, the positional relationship between the resistance element 206 and the protective layer 207 is shown in FIG. 10.

The resistance element 206 is formed as a thick film resistor having a thickness of about 10 µm on a first main surface 202*a* of the flat-type base member 202 through, e.g., a screen printing. As described in the first embodiment, a mixture powder of, e.g., ruthenium oxide ($RuO_2$) and glass is used as a material of the resistance element 206. The mixture powder is mixed with an organic binder to produce a paste. The paste is applied on the flat-type base member 202 and baked at a temperature of 800 to 900 degrees Celsius to thereby form the resistance element 206.

On both ends of the resistance element 206, the pair of internal electrodes 204 are disposed. The internal electrode 204 is made of, e.g., silver-palladium or platinum. The internal electrode 204 is plated with nickel and tin (not shown). The flat-type base member 202 and the resistance element 206 may be integrally formed so as not to be separable from each other.

On both ends of a long side of the flat-type base member 202 on which the resistance element 206 is formed, the pair of external electrodes 210 are attached. As described above, the external electrode may have a modified E-shape. This modified E-shaped external electrode 210 may have a structure with an upper spatial region and a lower spatial region (e.g., the second lateral portion 214*b* defining the lower spatial region is horizontally shifted toward the flat-type base member 202 so that it is located closer to the flat-type base member 202 than the first lateral portion 214*a* defining the upper spatial region, which makes the lower spatial region have a smaller horizontal dimension than the upper spatial region, as shown in FIG. 9). One feature of the fourth embodiment is that the resistance elements 206 are disposed in the upper spatial region of the pair of external electrodes 210 and the lower spatial region thereof is used as the space portion 210*s*.

In the fourth embodiment shown in FIG. 9, the flat-type base member 202 is more biased toward the first bended portion 210*a* in the thickness direction than the second bended portion 210*b* as in the first embodiment shown in FIG. 1 and FIG. 2. In other words, the flat-type base member 202 is disposed away from the substrate connection portion 216.

Both ends of the second main surface 202*b* of the flat-type base member 202 and a part of the middle portions 224 are fixed to each other through an adhesive 242. As the adhesive 242, a UV adhesive is used, for example. The first main surface 202*a* of the flat-type base member 202 with the resistance element 206 formed thereon is fixed to the internal electrode connection portion 212 of the external electrode 210 by interposing the conductive fixation material 208 between the internal electrode 204 and the internal electrode connection portion 212. Also, the second main surface 202*b* of the flat-type base member 202 is fixed to the middle portions 224 of the external electrode 210 by interposing the adhesive 224 therebetween. In this way, opposing portions of the flat-type base member 202 in the thickness direction are fixed to the external electrode 210, such that the fixation strength thereof may be increased.

The flat-type base member 202 is disposed in a space that is defined by a pair of U-shaped spatial regions being formed by a combination of the internal electrode connection portions 212, the first lateral portions 214*a*, and the middle portions 224 which constitute the pair of external electrodes 210. Therefore, the fixation strength of the flat-type base member 202 is further increased.

The space portion 210*s* is formed by a pair of another U-shaped spatial regions being formed by a combination of the middle portions 224, the lateral portions 214*b*, and the substrate connection portions 216. In this configuration, a space volume of the space portion 210*s* can be adjusted as desired by controlling a height of the second lateral portion 214*b*.

The internal electrode 204 and the internal electrode connection portion 212 are electrically connected to each other through the conductive fixation materials 208. As the conductive fixation material 208, a solder or a silver paste may be used.

FIG. 10 illustrates a lateral cross-sectional view of the surface-mounted resistor 200 shown in FIG. 9, showing a configuration of the surface-mounted resistor 200 mounted on a surface-mounted substrate. Components or portions corresponding to those shown in FIG. 9 have the same reference numerals.

The flat-type base member 202 is made of alumina having a high purity of, e.g., 92% or 96%. The alumina has excellent mechanical strength, thermal conductivity, and insulation properties. The pair of internal electrodes 204 are formed on the first main surface 202*a* of the flat-type base member 202. The pair of internal electrodes 204 may be made of baked silver-palladium, platinum, or the like. The resistance element 206 is formed on the first main surface 202*a* of the flat-type base member 202 by being partially superposed with the pair of internal electrodes 204. As a material of the resistance element 206, a mixed material of, e.g., ruthenium oxide ($RuO_2$) and glass, is used. A resistance value of the resistance element 206 can be controlled by changing a rate of mixing the ruthenium oxide ($RuO_2$) and the glass. A rate of containing the glass is increased to obtain a higher resistance value, whereas a rate of containing the ruthenium oxide ($RuO_2$) is increased to obtain a lower resistance value. It is known that the ruthenium oxide ($RuO_2$) has a resistant property against deterioration such as deformation, discoloration, degradation, and the like, i.e., an excellent weather resistant property.

The resistance element 206 is formed in a rectangular shape one side of which is longer than the other side. The resistance element 206 is covered with a protective layer (not shown). The protective layer is made of, e.g., glass or an epoxy resin.

The external electrode 210 is fixed to the internal electrode 204 by interposing the conductive fixation material 208 therebetween. The conductive fixation material 208 may be a solder or a silver paste.

Each of the pair of external electrodes 210 includes the internal electrode connection portion 212 to be fixed to each of the pair of internal electrodes 204 by interposing the conductive fixation material 208, the lateral portion 214, the substrate connection portion 216, and the middle portion 224, which are integrally and non-detachably formed using the same material. The first L-shaped bended portion 210*a* is formed by a combination of the lateral portion 214 and the internal electrode connection portion 212 being positioned on an upper side of the external electrode 210

The second L-shaped bended portion 210b is formed by a combination of the substrate connection portion 216 and the second lateral portion 214b. In addition, the third L-shaped bended portion 210c is formed by a combination of the first lateral portion 214a and the middle portion 224.

Each of the pair of external electrodes 210 is made up with a combination of the first to third L-shaped bended portions 210a, 210b, and 210c. Therefore, each of the pair of external electrodes 210 is configured to have an E-shape consisting of the combination of three L-shapes.

When viewing the first lateral portion 214a and the second lateral portion 214b in a direction x2, the second lateral portion 214b is disposed closer to the end 202s of the flat-type base member 202 than the first lateral portion 214a. That is, the first lateral portion 214a and the second lateral portion 214b are not disposed on the same plane. This restrains the increase of a mounting area when mounting the surface-mounted resistor 200. Specifically, if the substrate connection portion 216 is disposed to be aligned with the first lateral portion 214a on the same plane, when the substrate connection portion 216 is fixed to the first adhesive surface 222a or the second adhesive surface 222b through a solder 218, the solder 218 may bulge from the end of the external electrode 210. This increases a fixation region between the substrate connection portion 216 and the first adhesive surface 222a or second adhesive surface 222b.

While it may increase the connection region, the external electrode 210 of a complete E-shape as shown in FIG. 10 may be manufactured with a better facility than the modified E-shape. Also, considering a manufacturing facility, the external electrode 210 may be configured to align the end 224t of the middle portion 224 and the end 216t of the substrate connection portion 216 along the same plane. Depending on the above requirements, the external electrode 210 in accordance with the present disclosure may have either the modified E-shape or the complete E-shape.

In the above, four embodiments in accordance with the present disclosure have been described in detail. The surface-mounted resistor in accordance with the present disclosure may be applicable to a high resistor having a high resistance value. In the high resistor, a variation of a resistance value caused by attaching the external electrode to the internal electrode can be neglected.

In FIG. 3B, there is shown the example where the protective layer 107 is partially covered with the protective material 142 (142b). Alternatively, in some embodiments, the protective layer 107 may not be covered with the protective material 142 (142b). Further, in FIG. 3B, the protective material 142a is not placed on the second main surface 102b of the flat-type base member 102. In some embodiments, the protective material 142a may be placed on the second main surface 102b. Moreover, the respective components of each of the embodiments in accordance with the present disclosure may be properly selected and combined in a different manner to form a novel configuration. For example, in the other configurations than the one shown in FIG. 3B, the conductive fixation material 108 may be covered with the protective material 142.

In a similar manner as disclosed in Patent Document 7, the surface-mounted resistor in accordance with the present disclosure may be employed in an electric leakage detection apparatus that is mounted on, e.g., a hybrid car or an electric motor vehicle. A secondary battery of the hybrid car or the electric motor vehicle utilizes a relatively high voltage such as, e.g., 200 to 500 volt. For preventing an electric shock, such electric leakage detection apparatus employs a surface-mounted resistor having a significantly high resistance value of, e.g., 1 to 10 Mega Ohm. For this purpose, durability against thermal impact or mechanical vibration applied from the surface-mounted substrate is required rather than a flat structure.

In the surface-mounted resistor in accordance with the present disclosure, a height of the external electrode may be controlled so as to form a predetermined space portion between the flat-type base member with the resistance element formed thereon and the surface-mounted substrate. This may restrain damage and deterioration resulting from stress due to thermal expansion and contraction applied from the surface-mounted substrate. Also, even in the processing of mounting the surface-mounted resistor, the surface-mounted substrate in accordance with the present disclosure prevents the spread of solder wetting up to the space portion that is formed between the flat-type base member and the surface-mounted substrate, thereby restraining stress due to thermal expansion and contraction applied to the resistance element.

As described above, in the surface-mounted resistor according to one embodiment of the present disclosure, the resistance element is formed in the rectangular flat-type base member and the external electrode having first and second L-shaped bended portions is fixed to the internal electrode of the resistance element. In this configuration, a distance between the first and second bended portions can be controlled to secure a sufficient space volume of the space portion. In this way, stress due to thermal expansion and contraction applied from the surface-mounted substrate can be effectively alleviated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications which would fall within the scope and spirit of the inventions.

What is claimed is:

1. A surface-mounted resistor comprising:
a flat-type base member including a first main surface, a second main surface, and a lateral surface, each of the first main surface and the second main surface having a rectangular shape one side of which is longer than the other side thereof;
a resistance element formed on the first main surface of the flat-type base member;
a pair of internal electrodes formed on both ends of the resistance element by being partially superposed with the resistance element; and
a pair of external electrodes, each including a first bended portion, a second bended portion, an internal electrode connection portion, a lateral portion, and a substrate connection portion, the first bended portion having an L-shape made up by the internal electrode connection portion and the lateral portion, and the second bended portion having an L-shape made up by the lateral portion and the substrate connection portion,
wherein the internal electrode and the internal electrode connection are fixed to each other through a conductive fixation material, and a position of the flat-type base member is biased in a thickness direction toward the first bended portion.

2. The surface-mounted resistor of claim 1, wherein each of the external electrodes is configured to have a Z-shape made up by a combination of the first bended portion and the second bended portion, wherein an upper portion of the Z-shaped external electrode corresponds to the internal electrode connection portion of the external electrode, a lower portion of the Z-shaped external electrode corresponds to the substrate connection portion of the external electrode, a connection portion for connecting the upper portion of the Z-shaped external electrode to the lower portion thereof corresponds to the lateral portion of the external electrode, and the substrate connection portion is configured to protrude away from an end of the longer side of the flat-type base member.

3. The surface-mounted resistor of claim 1, wherein the flat-type base member is suspended from the internal electrode connection portion by interposing the conductive fixation material between the flat-type base member and the internal electrode connection portion.

4. The surface-mounted resistor of claim 1, wherein the flat-type base member is placed on the internal electrode connection portion by interposing the conductive fixation material between the flat-type base member and the internal electrode connection portion.

5. The surface-mounted resistor of claim 1, wherein an area of the external electrode facing the internal electrode is set to be greater than an area of the external electrode facing the lateral surface of the flat-type base member.

6. The surface-mounted resistor of claim 1, wherein a space volume ratio Va is defined by the following equation:

Va=H4/H1, wherein H1 is a height from the second bended portion to the first bended portion and H4 is a height from the second bended portion to the second main surface of the flat-type base member, and wherein the space volume ratio Va is in the range of 0.3 to 0.9.

7. The surface-mounted resistor of claim 1, wherein a space volume ratio Va is defined by the following equation:

Va=H4/H1, wherein H1 is a height from the second bended portion to the first bended portion and H4 is a height from the second bended portion to the second main surface of the flat-type base member, and wherein the space volume ratio Va is in the range of 0.5 to 0.8.

8. The surface-mounted resistor of claim 1, wherein a predetermined space is provided between the second main surface of the flat-type base member and the substrate connection portion in the thickness direction of the flat-type base member.

9. The surface-mounted resistor of claim 1, wherein a distance between the pair of internal electrodes is 5.2 mm or greater.

10. The surface-mounted resistor of claim 1, wherein a gap is provided between the lateral portion and the end of the longer side of the flat-type base member.

11. The surface-mounted resistor of claim 1, wherein a part of the lateral portion and the second main surface of the flat-type base member are fixed to each other through an adhesive.

12. The surface-mounted resistor of claim 1, wherein the external electrode is configured to have an E-shape including an upper region and a lower region, which are spatially divided by a middle portion being provided between the first bended portion and the second bended portion, wherein the flat-type base member is disposed in the upper region of the E-shaped external electrode, and the lower region of the E-shaped external electrode defines a space portion.

13. The surface-mounted resistor of claim 1, wherein a slit is provided on at least one of the lateral portion and the substrate connection portion, the slit penetrating at least one of the lateral portion and the substrate connection portion in a thickness direction.

14. The surface-mounted resistor of claim 1, wherein recesses and protrusions are provided on at least one of the lateral portion and the substrate connection portion in a thickness direction.

15. The surface-mounted resistor of claim 12, wherein a part of the second main surface of the flat-type base member and a part of the middle portion are fixed to each other through an adhesive.

16. The surface-mounted resistor of claim 1, wherein a resistance value of the surface-mounted resistor is 1 Mega Ohm or more.

17. An electric motor vehicle comprising the surface-mounted resistor of claim 16.

18. A surface-mounted substrate for mounting the surface-mounted resistor according to claim 1, the surface-mounted substrate comprising, a first adhesive surface and a second adhesive surface configured to be connected to both ends of the surface-mounted resistor, respectively, wherein a shortest distance between the pair of lateral portions of the surface-mounted resistor is less than a shortest distance between an end of the first adhesive surface and an end of the second adhesive surface facing the end of the first adhesive surface.

19. The surface-mounted resistor of claim 1, wherein a surface of the conductive fixation material is covered with a protective material.

20. The surface-mounted resistor of claim 19, wherein the protective material is made of an insulation resin.

* * * * *